(12) United States Patent
Yoshida

(10) Patent No.: US 8,525,238 B2
(45) Date of Patent: Sep. 3, 2013

(54) SEMICONDUCTOR DEVICE PRODUCTION METHOD AND SEMICONDUCTOR DEVICE

(75) Inventor: Eiji Yoshida, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 39 days.

(21) Appl. No.: 13/198,773

(22) Filed: Aug. 5, 2011

(65) Prior Publication Data

US 2012/0119267 A1 May 17, 2012

(30) Foreign Application Priority Data

Nov. 17, 2010 (JP) ................................. 2010-256762

(51) Int. Cl.
*H01L 29/76* (2006.01)

(52) U.S. Cl.
USPC ............. 257/288; 257/48; 438/297; 438/303; 438/479

(58) Field of Classification Search
USPC .................... 257/48, 288; 438/297, 303, 479
See application file for complete search history.

(56) References Cited

U.S. PATENT DOCUMENTS

| | | | | | |
|---|---|---|---|---|---|
| 4,616,399 | A * | 10/1986 | Ooka | | 438/297 |
| 5,598,010 | A * | 1/1997 | Uematsu | | 257/48 |
| 6,104,040 | A * | 8/2000 | Kawachi et al. | | 257/59 |
| 6,563,152 | B2 * | 5/2003 | Roberds et al. | | 257/288 |
| 6,583,469 | B1 * | 6/2003 | Fried et al. | | 257/329 |
| 6,878,597 | B2 * | 4/2005 | Kim | | 438/303 |
| 6,953,738 | B2 * | 10/2005 | Veeraraghavan et al. | | 438/479 |
| 7,011,980 | B1 * | 3/2006 | Na et al. | | 438/17 |
| 7,042,007 | B2 * | 5/2006 | Yasui et al. | | 257/48 |
| 7,504,270 | B2 * | 3/2009 | Wu et al. | | 438/17 |
| 7,820,530 | B2 * | 10/2010 | Min et al. | | 438/479 |
| 2006/0038171 | A1 * | 2/2006 | Hasumi et al. | | 257/48 |
| 2008/0185581 | A1 * | 8/2008 | Chen et al. | | 257/48 |
| 2008/0311718 | A1 * | 12/2008 | Futase | | 438/296 |
| 2009/0101976 | A1 * | 4/2009 | Madhavan et al. | | 257/347 |
| 2009/0159967 | A1 * | 6/2009 | Edwards et al. | | 257/335 |
| 2011/0115030 | A1 * | 5/2011 | Kitano | | 257/392 |

FOREIGN PATENT DOCUMENTS

JP 2002-299633 A 10/2002

\* cited by examiner

*Primary Examiner* — Ha Tran T Nguyen
*Assistant Examiner* — Ismail Muse
(74) *Attorney, Agent, or Firm* — Fujitsu Patent Center

(57) ABSTRACT

A semiconductor device production method includes: forming a semiconductor region including a first region, a second region connecting with the first region and having a width smaller than that of the first region, and a third region connecting with the second region and having a width smaller than that of the second region; forming a gate electrode including a first part crossing the third region and a second part extending from the first part across the first region; forming a side wall insulation film on the gate electrode to cover part of the second region while exposing the remaining part of the second region; implanting a second conductivity type impurity into the first region and the remaining part of the second region; performing heat treatment; removing part of the side wall insulation film, and forming a silicide layer on the first region and the remaining part of the second region.

11 Claims, 15 Drawing Sheets

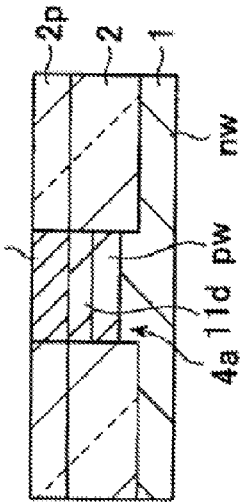
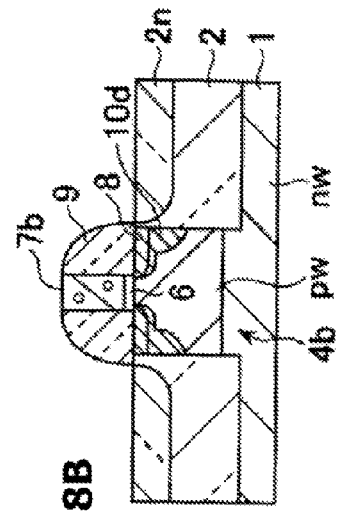
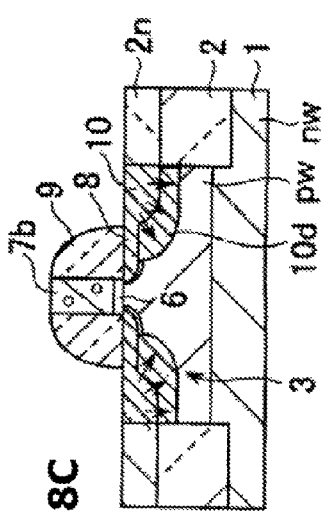
FIG. 8A
FIG. 8B
FIG. 8C
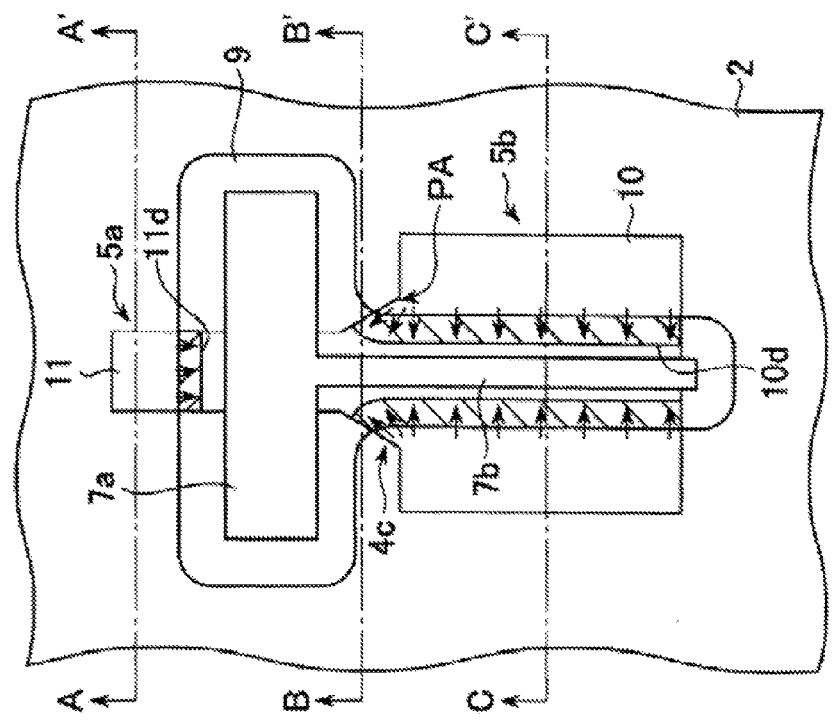
FIG. 8P

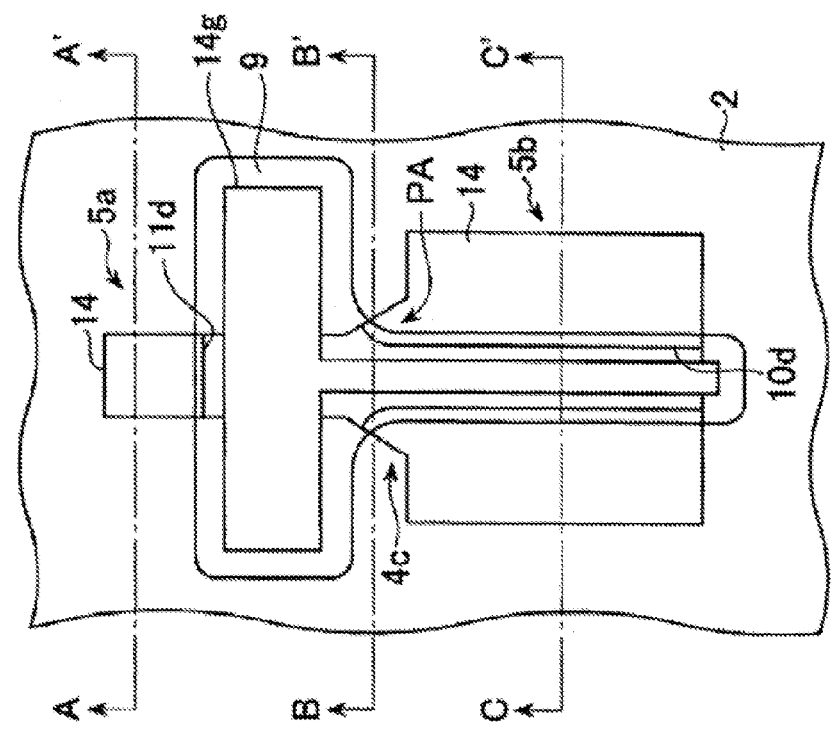
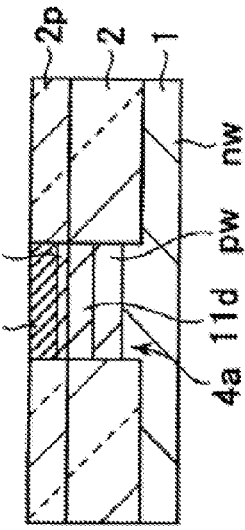
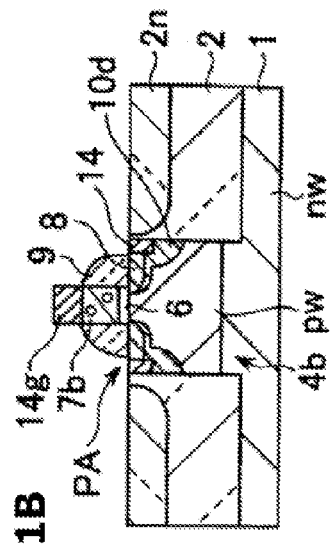
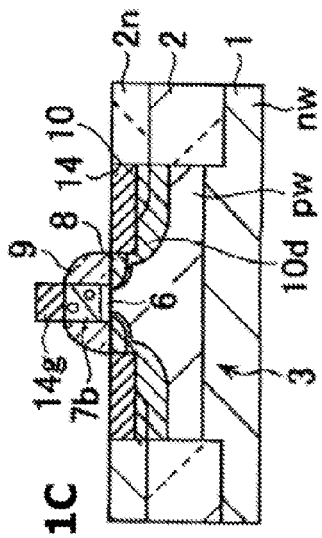
FIG. 11P
FIG. 11A
FIG. 11B
FIG. 11C

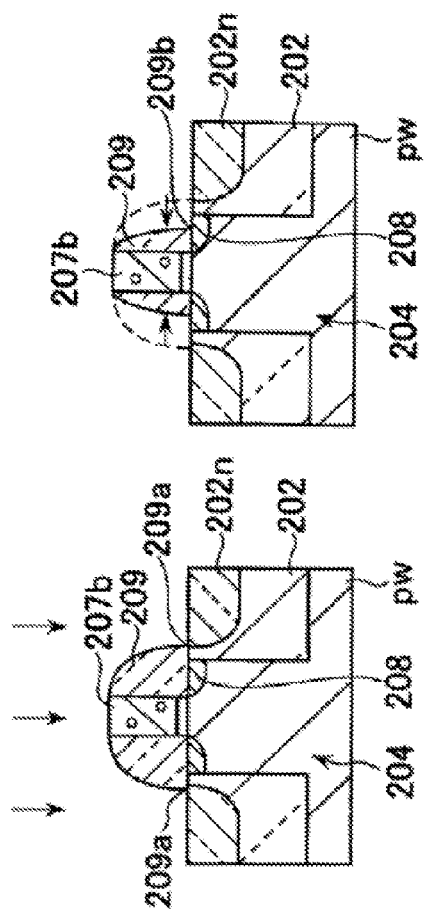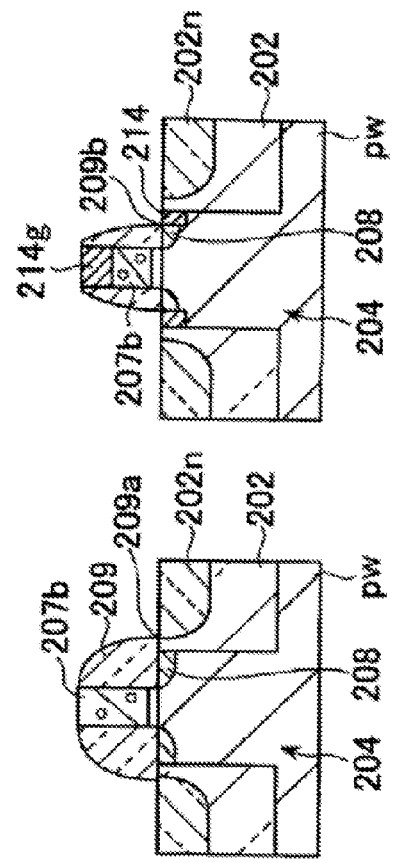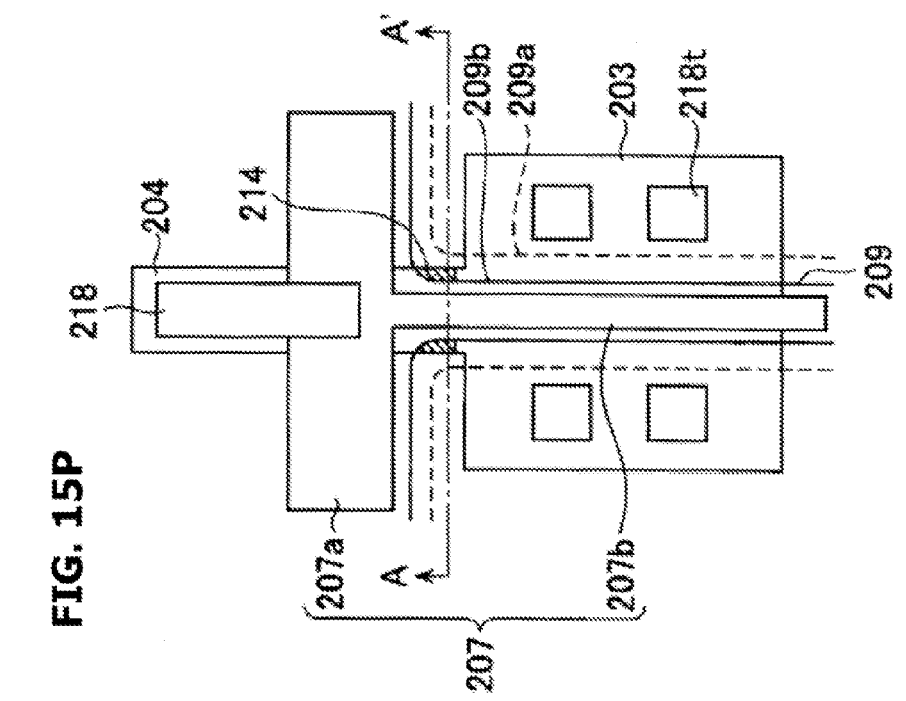

SEMICONDUCTOR DEVICE PRODUCTION METHOD AND SEMICONDUCTOR DEVICE

CROSS-REFERENCE TO RELATED APPLICATION

This application is based upon and claims the benefit of priority of the prior Japanese Patent Application No. 2010-256762, filed on Nov. 17, 2010, the entire contents of which are incorporated herein by reference.

FIELD

The embodiments discussed herein are related to a semiconductor device production method and a semiconductor device.

BACKGROUND

Dynamic threshold voltage MOS (DTMOS) transistors, i.e. MOS transistors with a gate electrode electrically connected to the body (well), have been developed (see, for instance, Japanese Unexamined Patent Publication (Kokai) No. 2002-299633). A DTMOS transistor can operate at a high speed at a low voltage due to a decrease in threshold voltage caused by applying a voltage to the well.

SUMMARY

According to an aspect of the invention, a semiconductor device production method includes: forming an element-separating insulation film in a semiconductor substrate to define a semiconductor region that includes a first region, a second region connecting with the first region and having a width smaller than a width of the first region, and a third region connecting with the second region and having a width smaller than the width of the second region; implanting a first conductivity type impurity into the semiconductor region to form a well region; forming a gate insulation film on the well region; forming, on the gate insulation film, a gate electrode that includes a first part crossing the third region in width direction of the third region and a second part extending from the first part across the first region; forming a side wall insulation film on the lateral face of the gate electrode to cover part of the second region while exposing the remaining part of the second region; implanting a second conductivity type impurity that has a conductivity type opposite to the first conductivity type into the first region and the remaining part of the second region using the gate electrode and the side wall insulation film as mask; performing heat treatment to diffuse the second conductivity type impurity; removing part of the side wall insulation film using a chemical, and forming a silicide layer on the first region and the remaining part of the second region after the removing of part of the side wall insulation film using the chemical.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1P, 1A, 1B, 1C to 12P, 12A, 12B, and 12C are schematic plan views and schematic cross-sectional views illustrating main steps of producing a DTMOS transistor according an embodiment.

FIGS. 15P, and 15A1 to 15A4 are a schematic plan view and schematic cross-sectional views of the DTMOS transistor of Comparative example 2.

DESCRIPTION OF EMBODIMENTS

Before describing the DTMOS transistor according to an embodiment of the invention, the DTMOS transistors of Comparative examples 1 and 2 are illustrated first.

Figure 13:
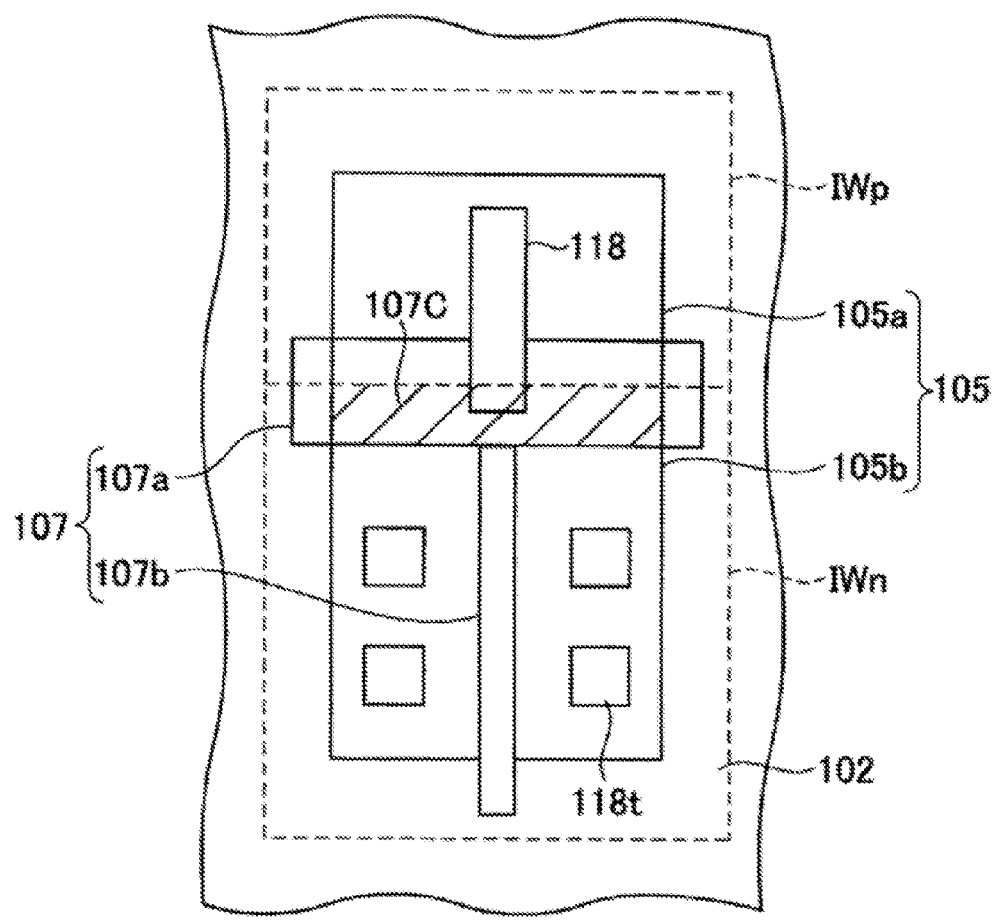
FIG. 13 is a schematic plan view of the DTMOS transistor of Comparative example 1.

FIG. 13 is a schematic plan view of the DTMOS transistor of Comparative example 1. An n-type MOS transistor is taken as an example for description. An element-separating insulation film 102 is formed on the silicon substrate, and a rectangular semiconductor region 105 is defined inside the surrounding element-separating insulation film 102. A p-type well is formed over the entire semiconductor region 105.

A gate electrode structure 107 of electrically conductive material is formed in the semiconductor region 105. The gate electrode structure 107 consists of a boundary portion 107a and a gate electrode portion 107b, and has a T shape with the boundary portion 107a and the gate electrode portion 107b representing the horizontal and the vertical segment, respectively. The boundary portion 107a extends across the semiconductor region 105 to define the contact region 105a, which is located on one side (upper side in the diagram) of the boundary portion 107a, and the transistor region 105b, which is located on the other side (lower side in the diagram) of the boundary portion 107a.

The gate electrode portion 107b extends across the transistor region 105b to form the gate electrode of the MOS transistor. N-type impurity has been added in each part of the transistor region 105b separated by the gate electrode portion 107b to form source/drain regions. The contact plugs 118t are electrically connected to source/drain regions.

The contact region 105a contains doped p-type impurity. The n-type impurity implanting window IWn and the p-type impurity implanting window IWp are shown by broken lines. The n-type impurity doped region and the p-type impurity doped region are separated at the center of the boundary portion 107a.

A contact plug 118 that is electrically connected to the p-type well is located on the contact region 105a. The contact plug 118 extends upward to the boundary portion 107a, and a voltage can be applied to both the p-type well and the gate electrode structure 107 via the contact plug 118. The DTMOS transistor of Comparative example 1 is thus configured.

The region 107C (indicated by upper-right diagonal lines), which is the n-type impurity doped part of the boundary portion 107a located on the semiconductor region 105, forms a capacitor electrode and develops a parasitic capacitance for the MOS transistor formed in the transistor region 105b. A smaller parasitic capacitance is more preferable.

Figure 14:
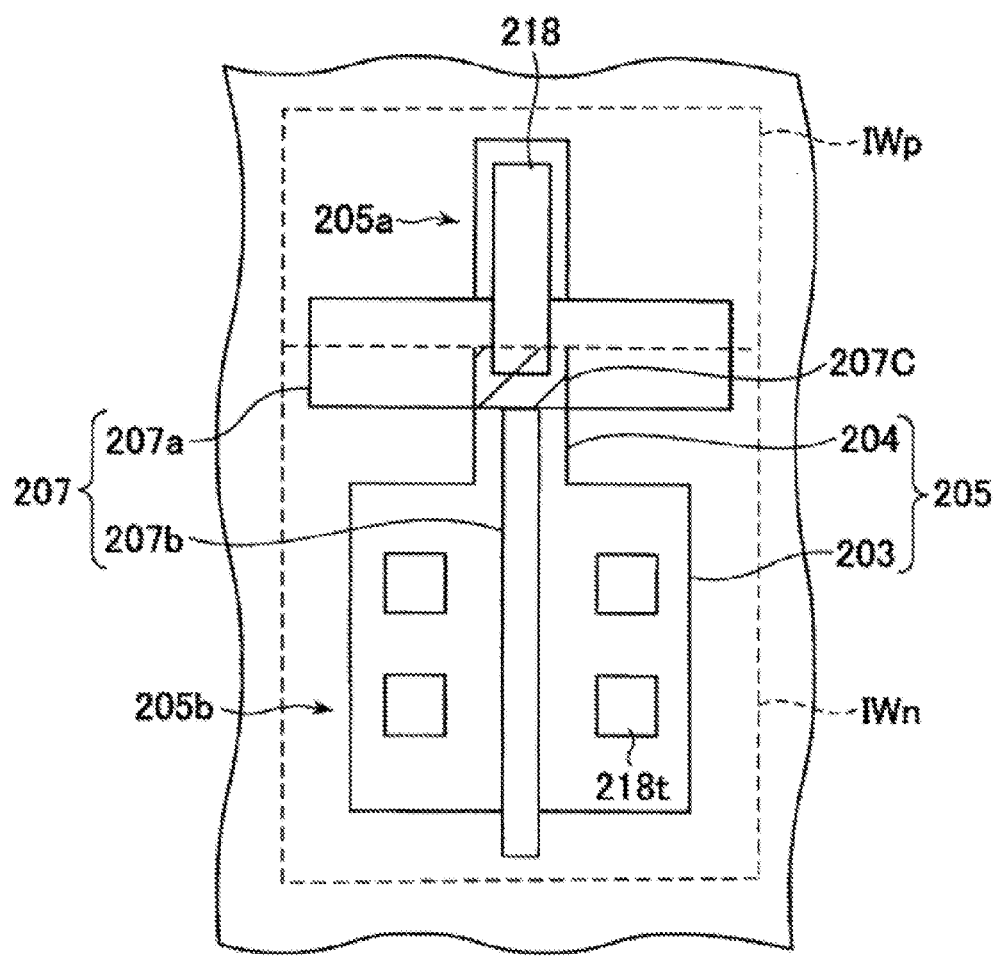
FIG. 14 is a schematic plan view of the DTMOS transistor of Comparative example 2.

FIG. 14 is a schematic plan view of the DTMOS transistor of Comparative example 2. The differences from Comparative example 1 are described below. In Comparative example 2, the shape of the semiconductor region 205 is different from that of the semiconductor region 105 of Comparative example 1.

The semiconductor region 205 of Comparative example 2 consists of a rectangular first region 203 and a second region 204 extending from the width-direction center part of the first region 203. The second region 204 is narrower than the first region 203. The second region 204 has a constant width.

The gate electrode structure 207 has a T shape as in the case of Comparative example 1. The boundary portion 207a extends across the second region 204 to separate the semiconductor region 205 into two parts, namely, the contact region 205a located on one side (upper side in the diagram) of the boundary portion 207a and the transistor region 205b located on the other side (lower side in the diagram) of the boundary portion 207a.

The first region 203 contains contact plugs 218t that are electrically connected to source/drain regions. The contact region 205a contains a contact plug 218 that is electrically connected to the p-type well and the boundary portion 207a.

In Comparative example 2, the second region 204 has a smaller width than the first region 203, and the boundary portion 207a extends across the second region 204 of the semiconductor region 205. This serves to shorten the part of the boundary portion 207a that exists on the semiconductor region 205. Accordingly, this reduces the size of the capacitor electrode region 207C which generates a parasitic capacitance. Thus, this serves to reduce the parasitic capacitance.

Problems with the DTMOS transistor of Comparative example 2 are described below with reference to FIGS. 15P, and 15A1 to 15A4.

FIG. 15P is a schematic plan view of the DTMOS transistor of Comparative example 2. FIG. 15P illustrates the side wall insulation film 209 formed on the lateral face of the gate electrode structure 207, viewed from the transistor side. The side wall insulation film 209 acts as mask for impurity implantation (SD implantation) to form source/drain regions. The broken line 209a in FIG. 15P indicates the position of the edge of the side wall insulation film 209 during the SD implantation.

After the SD implantation, silicide layers are formed over some parts including the source/drain region. Before the silicide layer formation, chemical treatment is carried out to remove natural oxide film from the substrate surface. As this chemical treatment proceeds, the side wall insulation film 209 is etched. The continuous line 209b in FIG. 15P indicates the position of the edge of the side wall insulation film 209 that has been etched by the chemical treatment.

FIGS. 15A1 to 15A4 are views of the AA' cross section that crosses the second region 204 between the first region 203 and the boundary portion 207a as seen in FIG. 15P, and illustrate major steps of producing the DTMOS of Comparative example 2.

FIG. 15A1 illustrates the SD implantation step. Before the SD implantation, n-type impurity has been implanted in the p-type well pw using the gate electrode portion 207b as mask to form an extension region 208.

After the formation of the extension region 208, the side wall insulation film 209 is formed on the lateral face of the gate electrode portion 207b. The gate electrode portion 207b is narrower than the second region 204, but the entire width of the side wall insulation film 209 (distance from one edge 209a to the other edge 209a with the gate electrode portion 207b between them) during the SD implantation is larger than that of the second region 204. Thus, the edge 209a of the side wall insulation film 209 is located on the element-separating insulation film 202 outside the second region 204.

The n-type impurity that is implanted during the SD implantation between the first region 203 and the boundary portion 207a enters the element-separating insulation film 202, instead of the semiconductor region, to form an impurity-implanted insulation film portion 202n.

FIG. 15A2 illustrates the impurity-activation annealing step. The n-type impurity implanted in the insulation film portion 202n in the SD implantation step does not diffuse significantly during the activation annealing step.

FIG. 15A3 illustrates the chemical treatment step to remove natural oxide film. As the chemical treatment proceeds, the side wall insulation film 209 is etched to expose the extension region 208 located on the second region 204.

FIG. 15A4 illustrates the silicide formation step. A silicide layer 214 is formed on the exposed second region 204, overlapping the extension region 208, and at the same time the silicide layer 214g is formed on top of the gate electrode portion 207b.

The silicide layer 214 formed on the second region 204 extends down more deeply than the extension region 208. This causes the p-type well pw and the silicide layer 214 to come in contact, leading to an increased junction leak. In FIG. 15P, the silicide layer 214 formed between the first region 203 and the boundary portion 207a and extending more deeply than the extension region 208 is indicated by upper-right diagonal lines.

In the first region 203 during the SD implantation, the impurity is implanted in the p-type well outside the side wall insulation film 209 to form source/drain regions that are higher in concentration and extend more deeply than the extension region 208. Furthermore, the impurity implanted in the source/drain region is diffused by the activation annealing. In the first region 203, it is possible to form a silicide layer shallower than the region dosed with the impurity by SD implantation. This serves to reduce the above-mentioned junction leak in the first region 203.

Described below is the DTMOS transistor according to an embodiment of the invention. FIGS. 1P, 1A, 1B, 1C to 12P, 12A, 12B, and 12C are schematic plan views and schematic cross-sectional views illustrating main steps of producing the DTMOS transistor according to the embodiment. Here, "P" denotes the plan view and "A", "B", and "C" denote the cross-sectional views of the AA', BB', and CC' cross sections, respectively, indicated in the plan view. Many DTMOS transistors of the same structure are formed simultaneously at regular intervals on one wafer, though diagramed and described below is only one DTMOS transistor to represent them. The formation of an n-type MOS transistor is described as a typical case.

See FIGS. 1P, and 1A to 1C. On a semiconductor substrate 1, for instance a p-type silicon substrate, an element-separating insulation film 2 is formed by, for instance, shallow trench isolation (STI) to define a semiconductor region 5 surrounded by the element-separating insulation film 2. The element-separating insulation film 2 formed by STI has a thickness of, for instance, about 300 nm to 400 nm.

The semiconductor region 5 includes a first region 3 and a second region 4. The first region 3 has, for instance, a rectangular shape with a width w3 of about 300 nm to 500 nm. The second region 4 extends from the width-direction center part of the first region 3, and has a smaller width than the first region 3.

In this embodiment, the second region 4 consists of a main portion 4a and a connection portion 4b that connects the main portion 4a to the first region 3. The main portion 4a has a rectangular shape with a smaller width than that of the first region 3, and the connection portion 4b has a trapezoidal shape with its width increasing towards the first region 3. The main portion 4a has a width w4a of, for instance, about 100 nm to 150 nm, and the connection portion 4b has a width 4wb of, for instance, about 200 nm to 250 nm at its center.

See FIGS. 2P, and 2A to 2C. A resist pattern RP1 that has an implantation window IW1 that exposes the entire semiconductor region 5 is formed. Using the resist pattern RP1 as mask, phosphorus, for instance, is implanted under the conditions of an accelerating energy of 300 keV to 400 keV and a dose of $5\times10^{12}$ cm$^{-2}$ to $5\times10^{13}$ cm$^{-2}$ to form an n-type well nw that is deeper than the element-separating insulation film 2.

Then, for instance, boron is implanted under the conditions of an accelerating energy of 30 keV to 60 keV and a dose of $5\times10^{12}$ cm$^{-2}$ to $5\times10^{13}$ cm$^{-2}$ to form a p-type well pw that is shallower than the element-separating insulation film 2. Furthermore, for instance, boron is implanted under the conditions of an accelerating energy of 5 keV to 20 keV and a dose of $5\times10^{12}$ cm$^{-2}$ to $5\times10^{13}$ cm$^{-2}$ for channel implantation. Subsequently, the resist pattern RP1 is removed.

An n-type DTMOS transistor is produced in the p-type well pw in each of the semiconductor regions 5 formed on the same wafer. These DTMOS transistors are electrically separated from each other by the n-type well nw.

See FIGS. 3P, and 3A to 3C. For instance, a silicon oxide film with a thickness of 1 nm to 2 nm is grown by thermal oxidation on the semiconductor region 5 to form a gate insulation film 6. Then, for instance, a polysilicon film with a thickness of 70 nm to 150 nm is deposited by chemical vapor deposition (CVD) over the entire substrate 1.

A resist pattern that has the same shape as the intended gate electrode structure 7 is formed on the polysilicon film, and this resist pattern is used as mask to pattern the polysilicon film, leaving the gate electrode structure 7. This etching also removes the gate insulation film 6 located outside the gate electrode structure 7. Subsequently, this resist pattern is removed.

The gate electrode structure 7 (the gate electrode 7) includes a boundary portion 7a and a gate electrode portion 7b. The boundary portion 7a extends across the main portion 4a of the second region 4 in the width direction to separate the semiconductor region 5 into two parts, namely the contact region 5a located on one side (upper side in the diagram) of the boundary portion 7a and the transistor region 5b located on the other side (lower side in the diagram) of the boundary portion 7a.

The portion of the second region 4 that is included in the transistor region 5b (i.e. the part of the main portion 4a that is located on the first region 3 side of the boundary region 7a, and the connection portion 4b) is hereinafter referred to as the collateral transistor region 4c. The transistor region 5b includes the first region 3 and the collateral transistor region 4c. Hereinafter, as compared with the collateral transistor region 4c, the first region 3 is occasionally referred to as the main transistor region 3. The boundary portion 7a has a width of, for instance, 100 nm to 200 nm (the direction laterally crossing the main portion 4a is defined as the length direction).

The gate electrode portion 7b extends across the transistor region 5b from the length-direction center part of the boundary portion 7a to form the gate electrode of a MOS transistor to be formed in the transistor region 5b. Here, the direction perpendicular to the extending direction of the gate electrode portion 7b is defined as the width direction of the main transistor region 3. The width of the gate electrode portion 7b (gate length) is, for instance, 50 nm. The width of the gate electrode portion 7b is smaller than that of the main portion 4a and connection portion 4b of the second region 4, and included in the width of the collateral transistor region 4c. The boundary portion 7a and the gate electrode portion 7b form a T-shape gate electrode structure 7.

The AA' cross section crosses the contact region 5a, and the BB' cross section crosses the connection portion 4b of the collateral transistor region 4c. The CC' cross section crosses the main transistor region 3.

In the DTMOS transistor of this embodiment, as in the case of Comparative example 2, the boundary portion 7a extends across the second region 4, which is narrower than the first region 3, of the semiconductor region 5. This is intended to reduce the parasitic capacitance.

See FIGS. 4P, and 4A to 4C. A resist pattern RP2 that has an implantation window IW2 that exposes the transistor region 5b of the semiconductor region 5 and covers the contact region 5a is formed. The contact-side edge of the implantation window IW2 (and the boundary between the implantation window IW3 for n-type impurity implantation and the implantation window IW4 for p-type impurity implantation described later with reference to FIG. 6P etc. and FIG. 7P etc., respectively) is located at a position within the width, for instance at the center of the width, of the boundary portion 7a.

Using the resist pattern RP2 and the gate electrode structure 7 as mask, boron, for instance, is implanted under the conditions of an accelerating energy of 5 keV to 20 keV and a dose of $5\times10^{12}$ cm$^{-2}$ to $5\times10^{13}$ cm$^{-2}$, or indium, for instance is implanted under the conditions of an accelerating energy of 20 keV to 70 keV and a dose of $5\times10^{12}$ cm$^{-2}$ to $5\times10^{13}$ cm$^{-2}$, in order to perform pocket implantation.

Then, for instance, arsenic is implanted under the conditions of an accelerating energy of 1 keV to 4 keV and a dose of $5\times10^{14}$ cm$^{-2}$ to $5\times10^{15}$ cm$^{-2}$ to form an extension region 8. Subsequently, the resist pattern RP2 is removed.

See FIGS. 5P, and 5A to 5C. To cover the gate electrode structure 7, for instance, a silicon oxide film with a thickness of 50 nm to 100 nm is deposited by CVD (film forming temperature 400° C. to 600° C.) over the entire surface of the substrate 1. This silicon oxide film is etched by anisotropic dry etching, leaving the side wall insulation film 9 on the lateral face of the gate electrode structure 7. The side wall insulation film 9 has a thickness of, for instance, 50 nm to 100 nm. Here, the side wall insulation film 9 may be formed of, for instance, nitride silicon, instead of silicon oxide, produced by CVD (film forming temperature 400° C. to 600° C.).

Figure 1A:
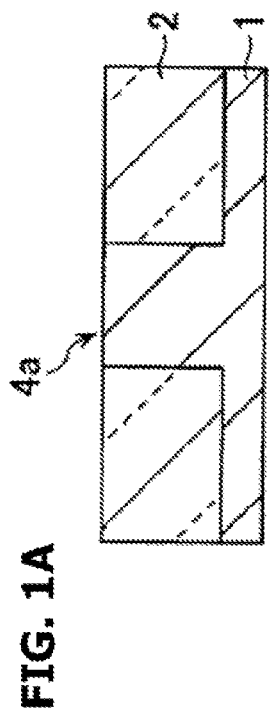
Figure 1B:
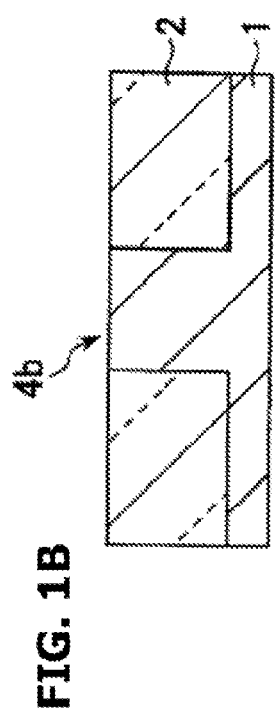
Figure 1C:
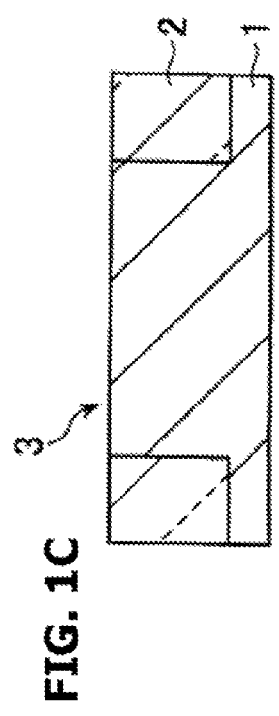
Figure 1P:
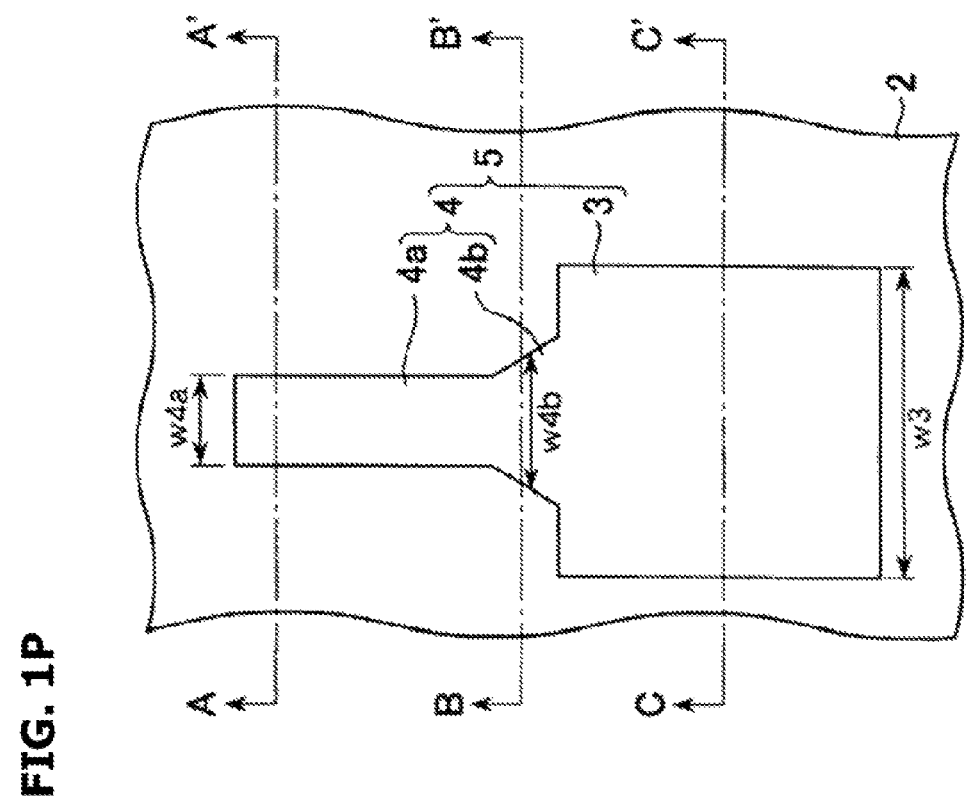
Figure 2P:
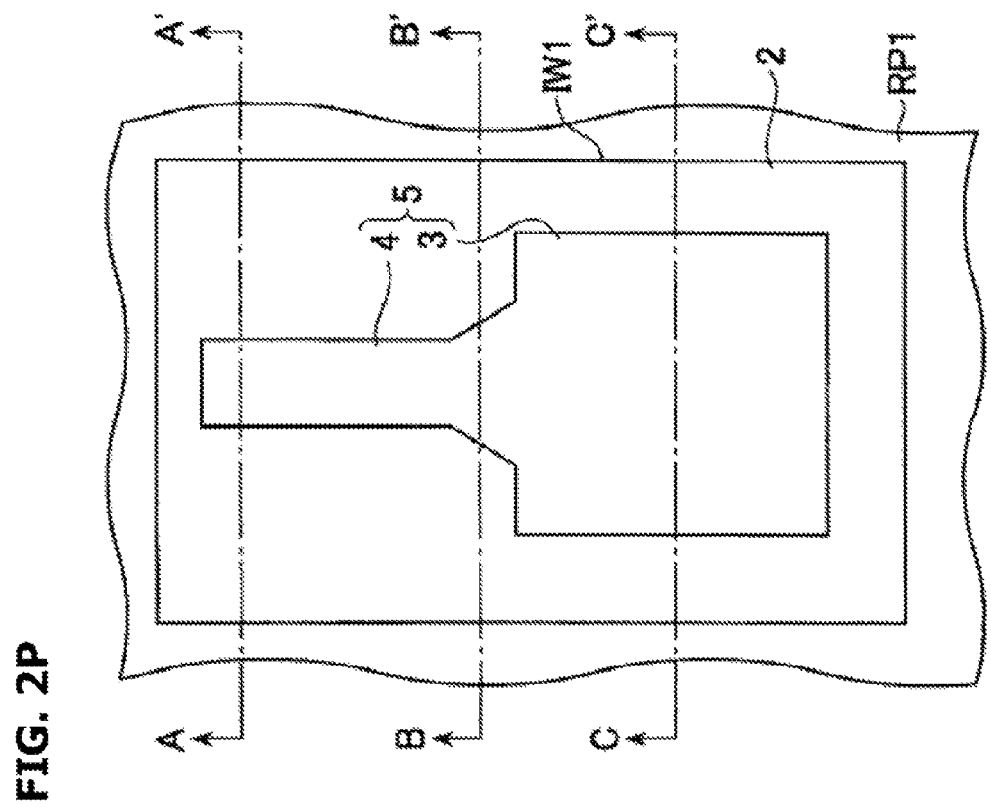
Figure 2A:
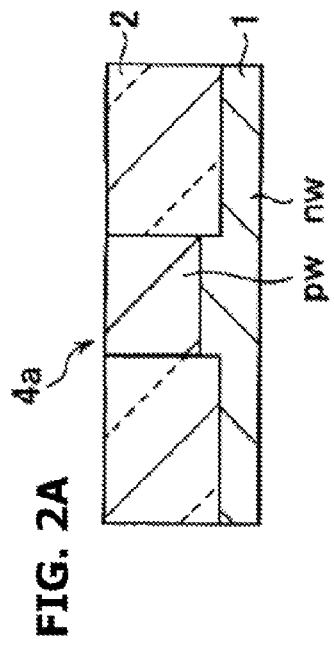
Figure 2B:
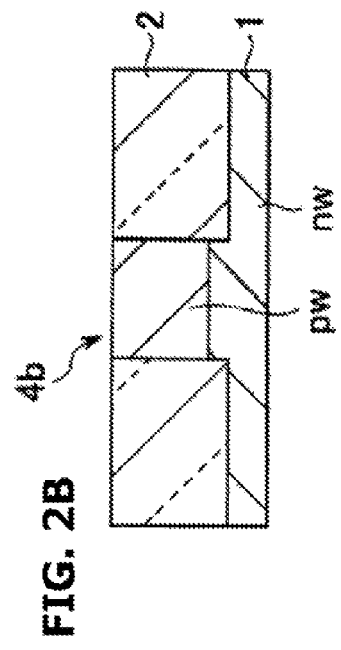
Figure 2C:
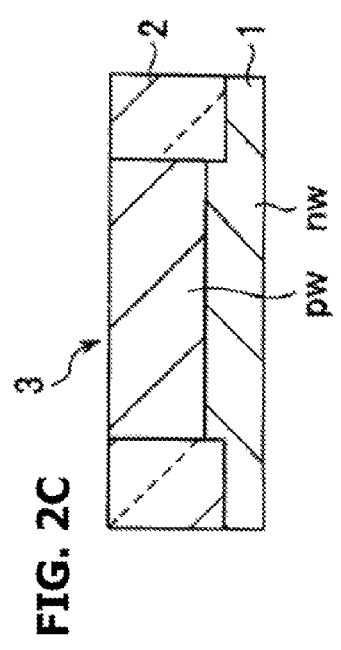
Figure 3A:
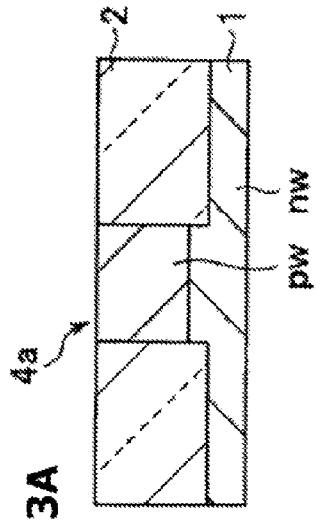
Figure 3B:
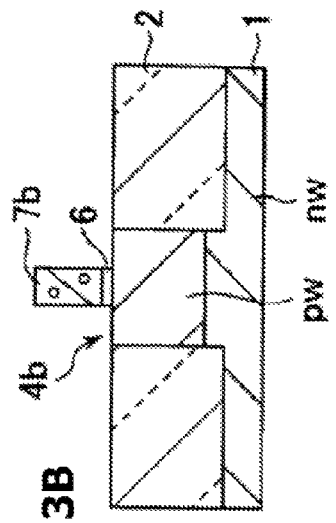
Figure 3C:
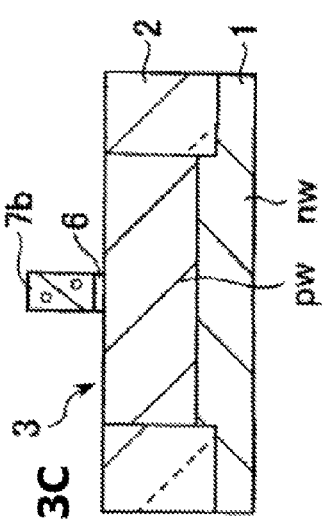
Figure 3P:
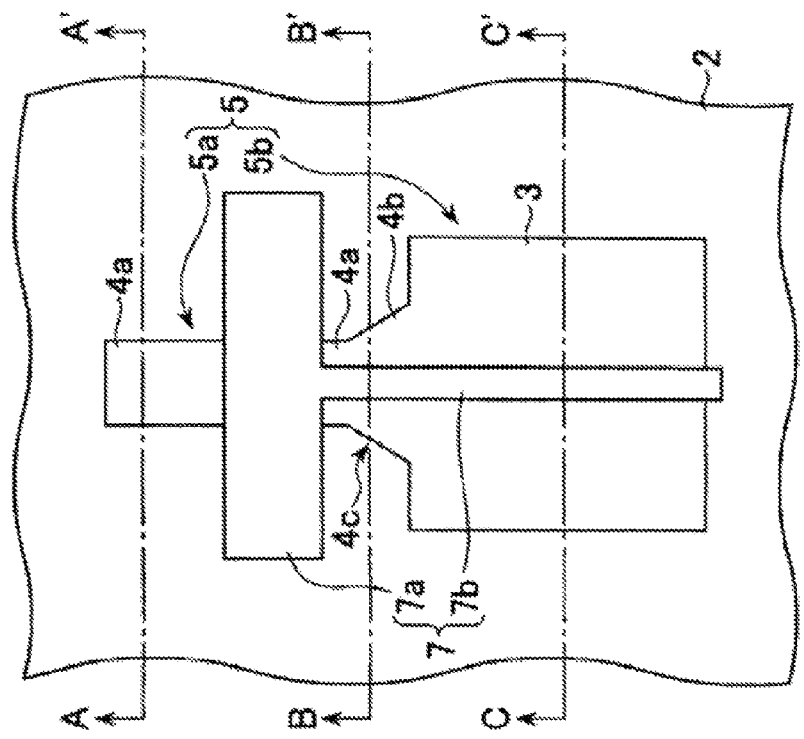
Figure 4A:
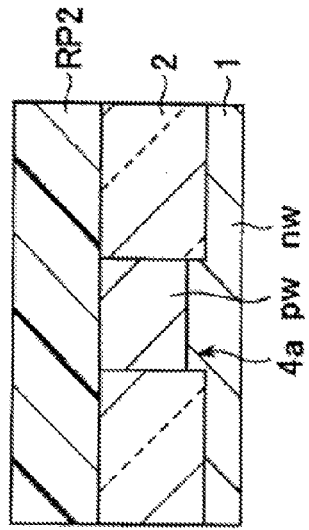
Figure 4B:
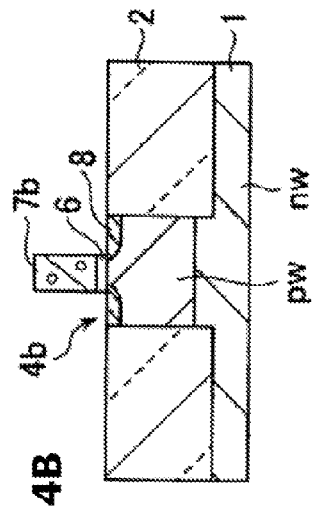
Figure 4C:
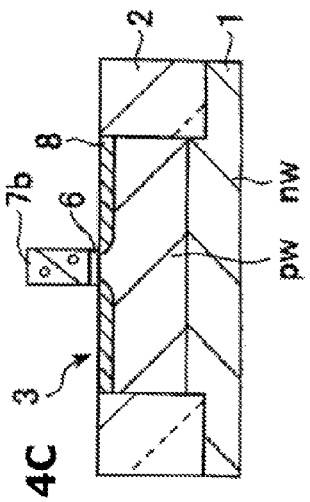
Figure 4P:
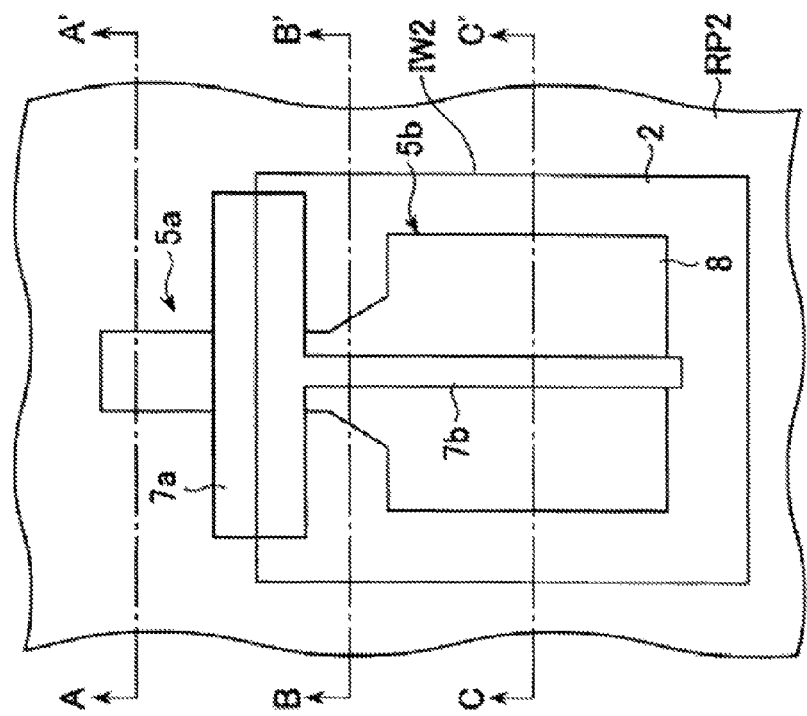
Figure 5A:
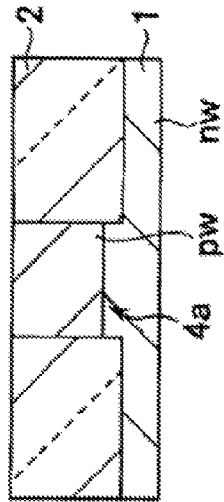
Figure 5B:
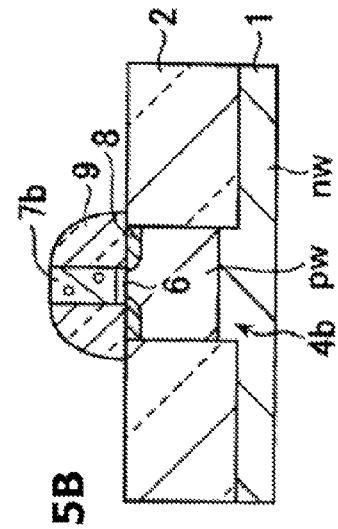
Figure 5C:
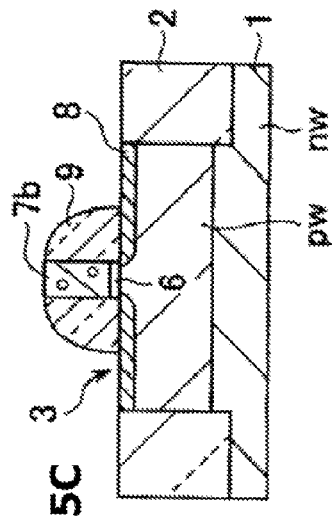
Figure 5P:
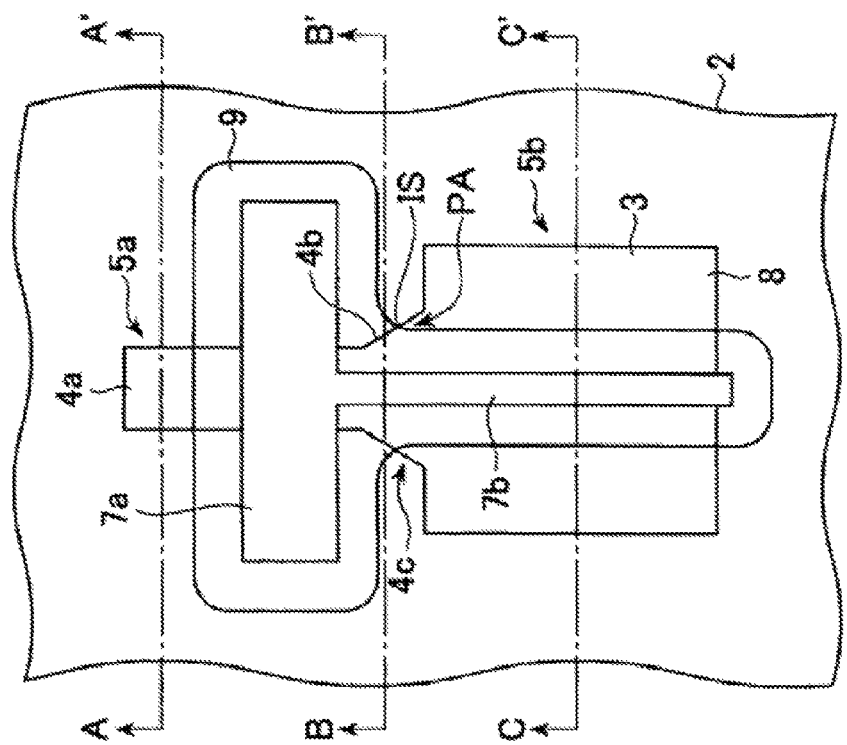

As seen from FIG. 5P, the entire width of the side wall insulation film 9 (distance from one edge to the other with the gate electrode structure 7 between them) is large on the boundary portion 7a, decreases near the joint between the boundary portion 7a and the gate electrode portion 7b, and becomes constant as the gate electrode portion 7b extends. On the extended segment of the gate electrode portion 7b, the overall width of the side wall insulation film 9 is larger than that of the main portion 4a of the second region 4.

In the connection portion 4b, on the other hand, the collateral transistor region 4c increases in width towards the main transistor region 3. As the width of the collateral transistor region 4c increases, the edge of the side wall insulation film 9 and that of the collateral transistor region 4c intersect each other. The overall width of the side wall insulation film 9 is larger than that of the second region 4 on the contact side of the intersection IS, while the overall width of the side wall insulation film 9 is smaller than that of the second region 4 on the transistor side of the intersection IS. As a result, in the connection portion 4b to the first region 3, the second region 4 has an exposed region PA protruding from the side wall insulation film 9.

The BB' cross section in FIG. 5B is located slightly away from the intersection IS towards the contact where the overall width of the side wall insulation film 9 is larger than that of the second region 4. In the BB' cross section, the outer edge of the side wall insulation film 9 is on the element-separating insulation film 2.

See FIGS. 6P, and 6A to 6C. A resist pattern RP3 that has an implantation window IW3 that exposes the transistor region 5b and covers the contact region 5a is formed.

Using the resist pattern RP3, the gate electrode structure 7, and the side wall insulation film 9 as mask, phosphorus, for instance, is implanted (SD implantation) under the conditions of an accelerating energy of 4 keV to 10 keV and a dose of $2\times10^{15}$ cm$^{-2}$ to $1\times10^{16}$ cm$^{-2}$ to form source/drain regions 10 that are n$^+$ type regions higher in concentration and deeper than the extension region 8.

The impurity is implanted in the protruding region PA of the collateral transistor region 4c. The impurity-implanted region formed by SD implantation in the protruding region PA is also called a source/drain region 10.

Here, the n-type impurity is implanted in those parts of the gate electrode structure 7 and the side wall insulation film 9 which are exposed in the implantation window IW3 and used as mask. Subsequently, the resist pattern RP3 is removed.

Figure 6A:
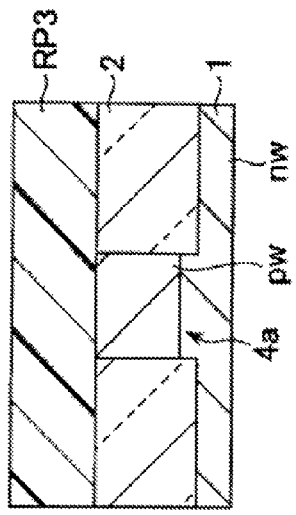
Figure 6B:
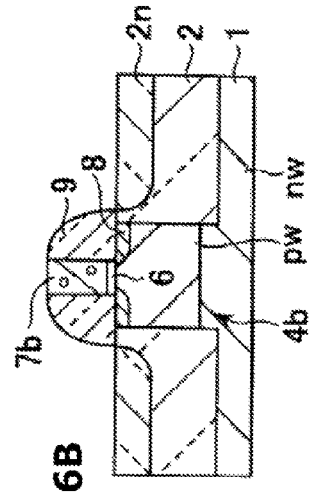
Figure 6C:
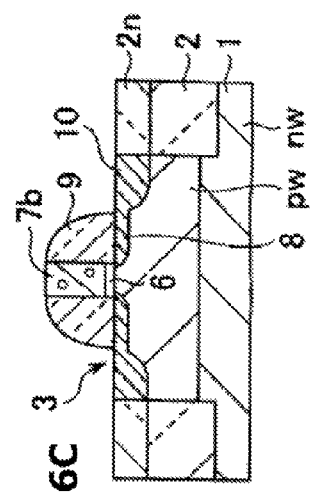
Figure 6P:
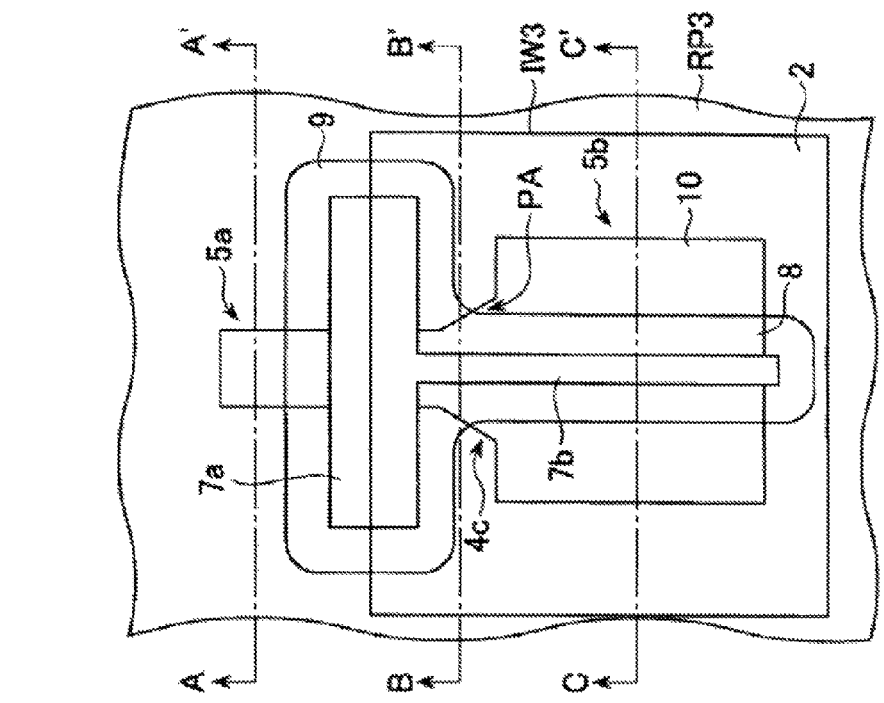

As seen from FIGS. 6C and 6P, in the main transistor region 3, the n-type impurity is implanted in the p-type well pw outside the side wall insulation film 9 to form source/drain regions 10. At the same time, the n-type impurity is also implanted in the element-separating insulation film 2 outside the p-type well pw to form an insulation film portion 2n that contains the n-type impurity.

As seen from FIGS. 6B and 6P, in the BB' cross section, the outer edge of the side wall insulation film 9 is located on the element-separating insulation film 2 and therefore, the n-type impurity is implanted in the element-separating insulation film 2 outside the side wall insulation film 9 to form an insulation film portion 2n that contains the n-type impurity.

See FIGS. 7P, and 7A to 7C. A resist pattern RP4 that has an implantation window IW4 that exposes the contact region 5a and covers the transistor region 5b is formed. Using the resist pattern RP4, the gate electrode structure 7, and the side wall insulation film 9 as mask, boron, for instance, is implanted under the conditions of an accelerating energy of 2 keV to 5 keV and a dose of $2\times10^{15}$ cm$^{-2}$ to $1\times10^{16}$ cm$^{-2}$.

Figure 7A:
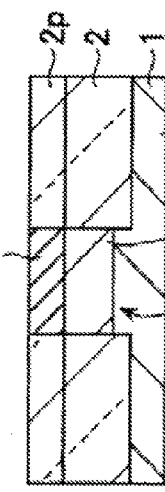
Figure 7B:
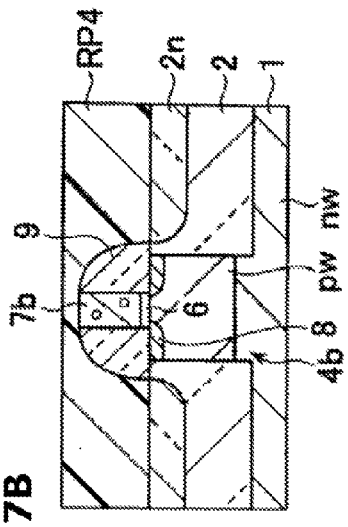
Figure 7C:
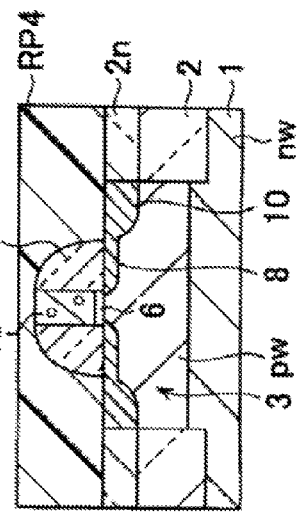
Figure 7P:
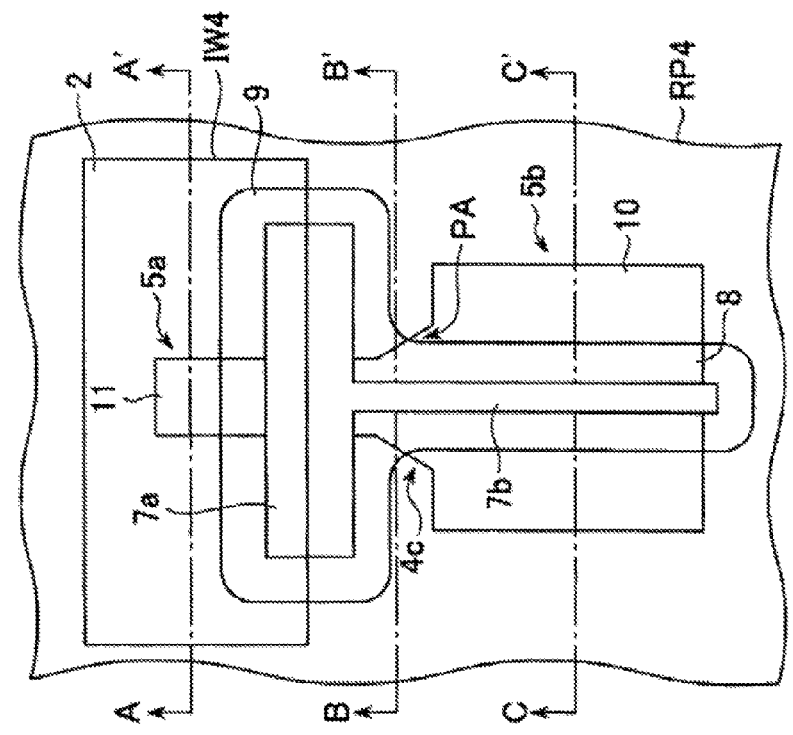

As seen from FIGS. 7A and 7P, a p$^+$ type region 11 is formed in the p-type well pw in the contact region 5a. The p-type impurity is also implanted in the element-separating insulation film 2 outside the p-type well pw to form an insulation film portion 2p that contains the p-type impurity. Here, the p-type impurity is implanted in those parts of the gate electrode structure 7 and the side wall insulation film 9 which are exposed in the implantation window IW4 and used as mask. Subsequently, the resist pattern RP4 is removed.

Note that only an n-type MOS transistor is formed in the present embodiment, but it is also possible to form an n-type MOS transistor and a p-type MOS transistor simultaneously on one wafer. In this case, a p$^+$ type region 11 can be formed by applying the p-type impurity implantation step performed here to form a source/drain region in the p-type MOS transistor.

See FIGS. 8P, and 8A to 8C. By using the rapid thermal annealing (RTA) method, heat treatment is carried out at, for instance, 1,000° C. to 1,100° C. for a period of 3 seconds or shorter to achieve activation annealing of the implanted n-type and p-type impurities. This activation annealing works to diffuse the implanted impurity over a distance of, for instance, 30 nm to 60 nm.

The n-type impurity implanted in the source/drain region 10 and the p-type impurity implanted in the p$^+$ type region 11 are diffused to cause the source/drain region 10 and the p$^+$ type region 11 to expand in the in-plane direction and the depth direction, respectively. The expanded parts resulting from the diffusion in the source/drain region 10 and the p$^+$ type region 11 are hereinafter referred to as diffusion region 10d and diffusion region 11d, respectively.

As the diffusion region 10d and the diffusion region 11d expand under the side wall insulation film 9, the edge shape of the diffusion region 10d and the diffusion region 11d are conformal to the edge shape of the side wall insulation film 9. In FIG. 8P, the diffusion region 10d and the diffusion region 11d expanding below the side wall insulation film 9 are indicated by upper-right and upper-left diagonal lines, respectively. The directions of diffusion of the impurity are indicated by arrows.

As seen from FIGS. 8C and 8P, in the main transistor region 3, the impurity is implanted in the area laterally outside the side wall insulation film 9 to form source/drain regions 10, and the impurity diffuses in the horizontal direction to get under the side wall insulation film 9.

As seen from FIGS. 8B and 8P, no source/drain region 10 is formed outside the side wall insulation film 9 at the position of the BB' cross section of the collateral transistor region 4c. Consequently, it is impossible for impurity diffusion to take place from source/drain regions 10 outside the side wall insulation film 9. Here, the impurity implanted in the element-separating insulation film portion 2n does not diffuse significantly.

However, a protruding region PA is formed in the collateral transistor region 4c at a position slightly away from the BB' cross section towards the main transistor region 3, and the protruding region PA also contains the impurity doped by SD implantation. The impurity implanted in the protruding region PA diffuses upward in the diagram along the edge of the collateral transistor region 4c, allowing a diffusion region 10d to be formed at the position of the BB' cross section.

See FIGS. 9P, and 9A to 9C. As pretreatment for the later step of silicide layer formation, natural silicon oxide film formed on the surface of the substrate 1 is removed by chemical treatment with, for instance, dilute hydrofluoric acid. This chemical treatment causes etching of the side wall insulation film 9. Etching under conditions for 6 nm reduction of thermal oxide, for instance, effects about 25 nm to 30 nm reduction of the high impurity concentration side wall insulation film 9 produced at a low temperature.

Here, the degree of reduction caused by etching of the side wall insulation film 9 depends on the film type, film forming temperature, quantity of implanted impurity, and impurity type. For instance, a film containing phosphorus implanted up to a high concentration during n-type MOS transistor formation is likely to be etched easily, while on the other hand, a film containing boron implanted during p-type MOS transistor formation is likely to be difficult to etch.

For instance, a side wall insulation film formed at a low temperature of 400° C. to 600° C. is etched more easily than one formed a high temperature of, for instance, 700° C. to 800° C. A side wall insulation film difficult to etch can be produced at an increased film forming temperature of 700° C. or so, but this causes the impurity to diffuse, leading to a transistor with inferior performance. It is preferable that a low process temperature is maintained during the steps from impurity implantation to activation annealing.

Figure 9A:
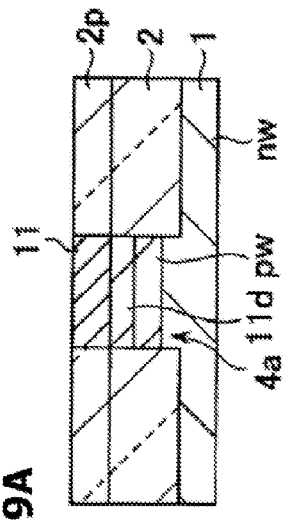
Figure 9B:
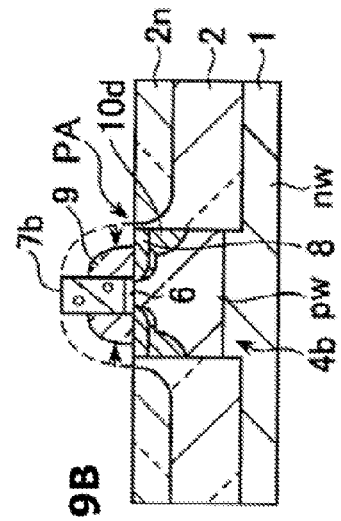
Figure 9C:
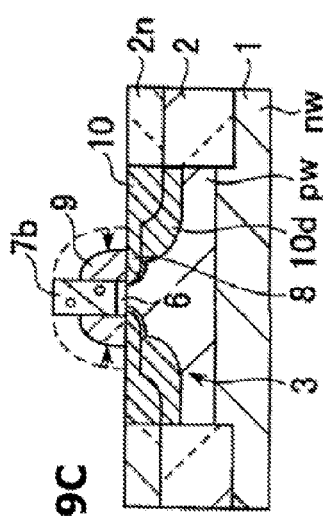
Figure 9P:
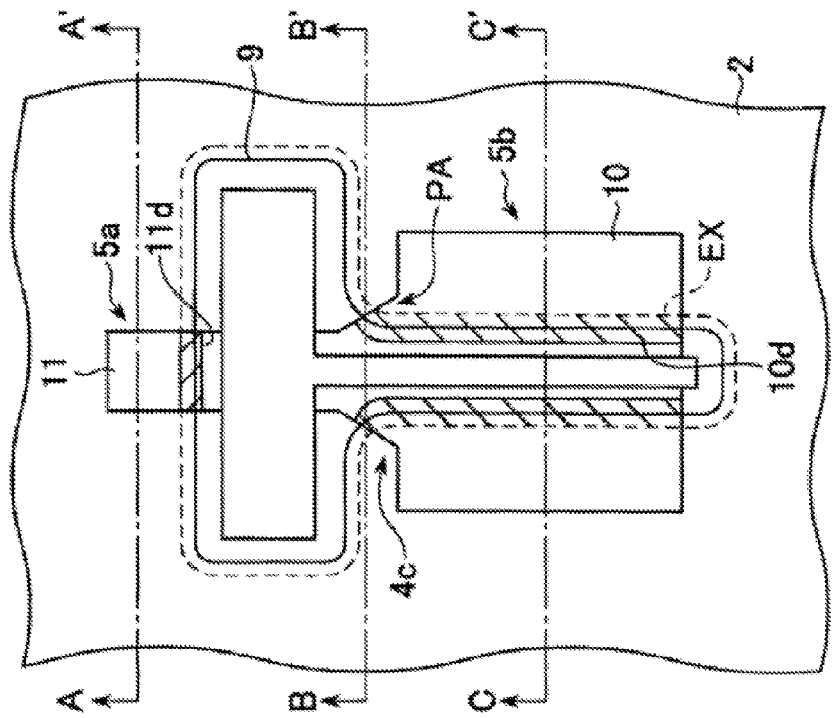
Figure 10A:
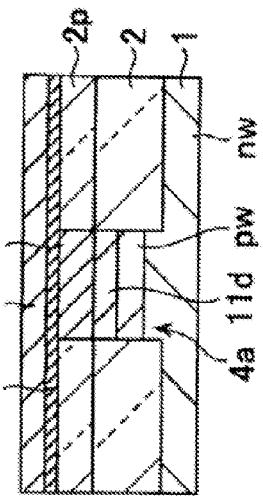
Figure 10B:
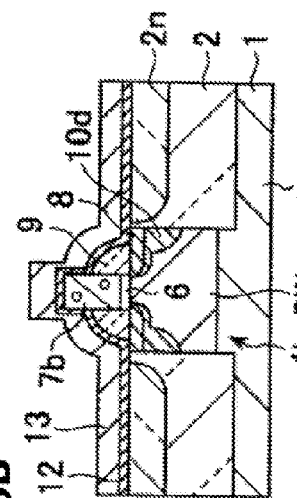
Figure 10C:
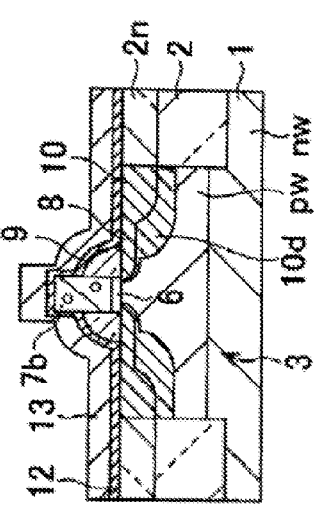
Figure 10P:
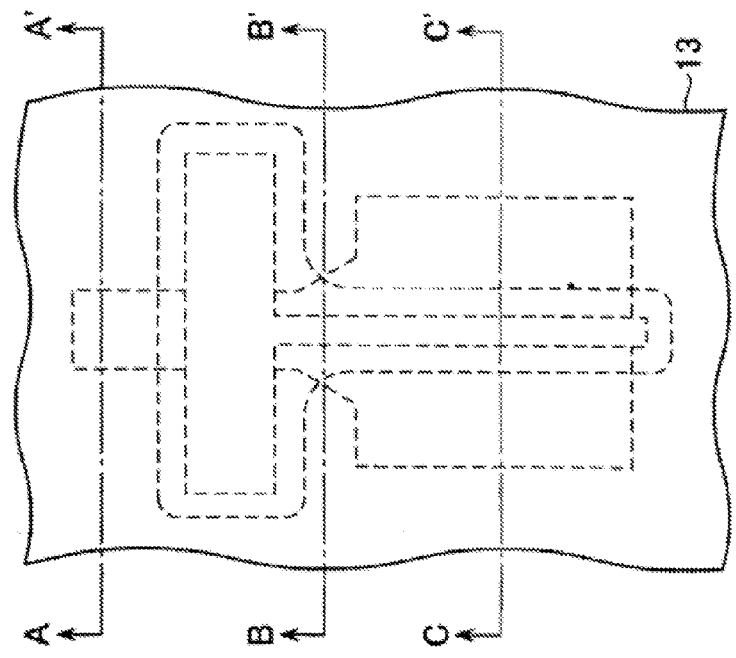
Figure 12A:
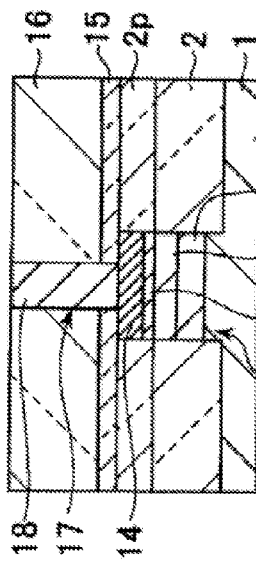
Figure 12B:
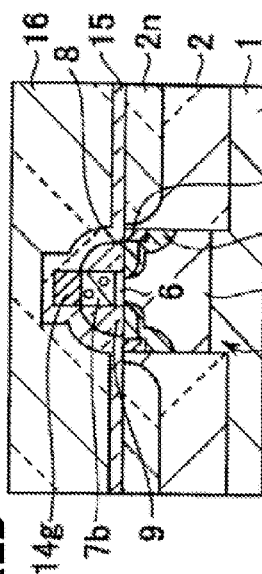
Figure 12C:
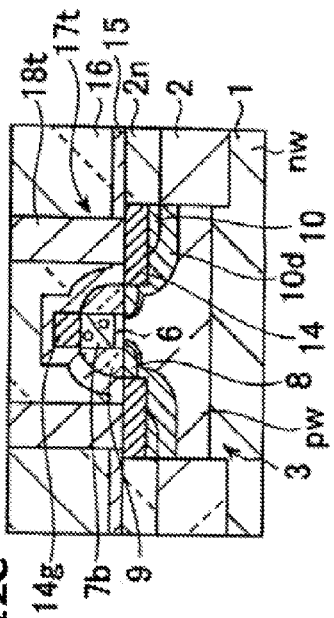
Figure 12P:
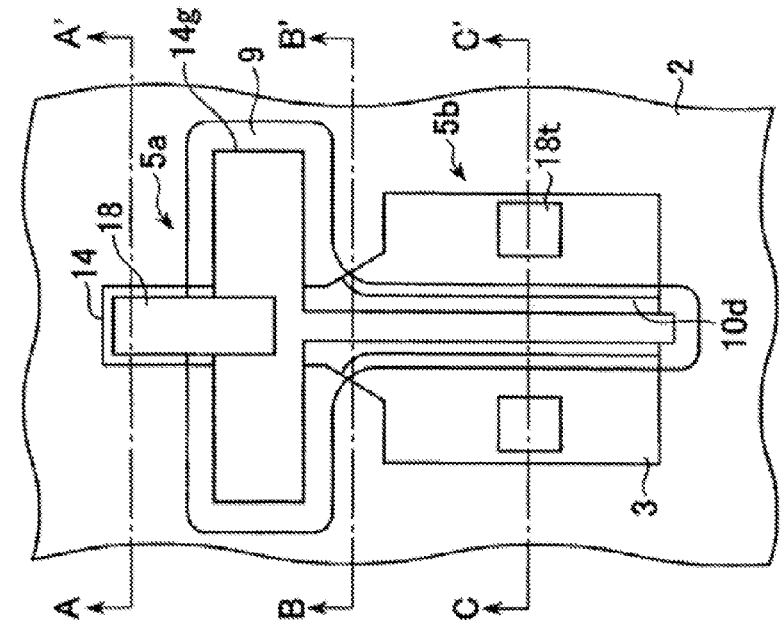

In FIG. 9P and other diagrams, the shape of the original side wall insulation film 9 is indicated by a broken line, while the shape of the reduced side wall insulation film 9 is indicated by a continuous line. As seen from FIG. 9P, the outline of the reduced side wall insulation film 9 is conformal to the outline of the original side wall insulation film 9.

As the side wall insulation film 9 reduces, part of the contact region 5a and the transistor region 5b, originally covered by the side wall insulation film 9, is exposed. The chemical treatment to remove natural oxide film is performed under conditions where the degree of reduction of the side wall insulation film 9 is smaller than the degree of diffusion of the impurity in the transistor region 5b in particular. Thus, in the transistor region 5b in particular, the exposed portion EX resulting from the reduction of the side wall insulation film 9 is within the diffusion region 10d where the impurity has diffused from the source/drain regions 10.

As seen from FIGS. 9B and 9P, the protruding region PA located outside the side wall insulation film 9 enlarges as the side wall insulation film 9 reduces, and the BB' cross section after the etching of the side wall insulation film 9 crosses the enlarged portion of the protruding region PA. The enlarged portion of the protruding region PA is within the impurity diffusion region 10d.

See FIGS. 10P, and 10A to 10C. A metal film to produce a silicide layer is formed over the entire surface of the substrate 1 to cover the gate electrode structure 7 and the side wall insulation film 9. For instance, sputtering is performed to deposit a cobalt film 12 up to a thickness of 5 nm, followed by further deposition of a titanium nitride film 13 up to a thickness of 15 nm on the cobalt film 12.

See FIGS. 11P, and 11A to 11C. A silicide layer is produced by carrying out heat treatment by RTA at, for instance, 550° C. for about 30 seconds. Then, wet etching with a mixture of sulfuric acid and hydrogen peroxide (SPM solution) is carried out to remove the unreacted parts of the titanium nitride film 13 and the cobalt film 12, leaving the silicide layer 14 formed on the semiconductor region 5 and the silicide layer 14g formed on the gate electrode structure 7. After removing the unreacted parts, additional RTA heat treatment is performed for about 30 seconds in a nitrogen atmosphere of about 700° C. to reduce the resistance of the silicide layers 14 and 14g.

The silicide layer 14 covers the entire exposed part of the semiconductor region 5 located outside the side wall insulation film 9. In the vicinity of the side wall insulation film 9, the silicide layer 14 is located on the diffusion region 10d in the transistor region 5b and on the diffusion region 11d in the contact region 5a. Note that the description here addresses cobalt silicide as material of the silicide layer, but others such as nickel silicide may be used instead.

As seen from FIGS. 11B and 11P, in the region PA where the connection portion 4b is exposed, the silicide layer 14 may be formed on the diffusion region 10d.

The diffusion region 10d and diffusion region 11d are formed more deeply in the substrate 1 than the silicide layer 14. This reduces the junction leak that can result from the silicide layer 14 reaching the p-type well pw in the entire transistor region 5b, particularly in the collateral transistor region 4c.

See FIGS. 12P, and 12A to 12C. An etching stopper film 15 is formed by depositing, for instance, nitride silicon by CVD up to a thickness of 50 nm to 100 nm over the entire substrate 1 to cover the gate electrode structure 7 and the side wall insulation film 9. An interlayer insulation film 16 is formed by depositing, for instance, silicon oxide by CVD up to a thickness of 300 nm to 600 nm on the etching stopper film 15.

After planarizing the top surface of the interlayer insulation film 16 by chemical mechanical polishing (CMP), photolithography and etching are carried out to form contact holes 17t and 17. The contact hole 17t is located on the main transistor region 3 and the contact hole 17 extends from the contact region 5a to the boundary portion 7a.

Subsequently, contact plugs 18t and 18 of tungsten are formed in the contact holes 17t and 17 with a titanium nitride film between them. The contact plugs 18t are electrically connected to the source/drain regions 10 of the MOS transistor. The contact plug 18 is electrically connected to the p-type well pw and the gate electrode structure 7. Thus, a DTMOS transistor of the embodiment is formed.

As described above, in the embodiment, a region PA protruding outward from the side wall insulation film 9 is formed in the connection portion 4b that connects the second region 4 to the first region 3. To produce this protruding region PA, the width of the second region 4 (the collateral transistor region 4c) between the boundary portion 7a and the first region 3 is increased towards the first region 3. Impurity is added to the protruding region PA by SD implantation, and the impurity implanted in the protruding region PA is diffused by activation annealing.

Consequently, in the collateral transistor region 4c, the semiconductor region EX exposed as a result of reduction of the side wall insulation film 9 can be easily confined within the diffusion region 10d of the impurity implanted by SD implantation, serving to reduce the junction leak attributable to the silicide layer 14 formed outside the side wall insulation film 9.

Note that the description here addresses an embodiment for formation of an n-type MOS transistor, but a p-type MOS transistor can be produced by a similar procedure by reversing the conductivity types.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device production method comprising:
forming an element-separating insulation film in a semiconductor substrate to define a semiconductor region that includes a first region, a second region connecting with the first region and having a width smaller than a width of the first region, and a third region connecting with the second region and having a width smaller than the width of the second region;
implanting a first conductivity type impurity into the semiconductor region to form a well region;
forming a gate insulation film on the well region;
forming, on the gate insulation film, a gate electrode that includes a first part crossing the third region in width direction of the third region and a second part extending from the first part across the second region and the first region;
forming a side wall insulation film on a side wall of the gate electrode, in the second region, the side wall insulation film covering a part of the second region while exposing a remaining part of the second region;
implanting a second conductivity type impurity that has a conductivity type opposite to the first conductivity type into the first region and the second region using the gate electrode and the side wall insulation film as a mask, to form a source region and a drain region in the first region and the second region on both sides of the second part of the gate electrode;

performing heat treatment to diffuse the second conductivity type impurity;

removing partial thickness of the side wall insulation film; and forming a silicide layer on the first region and the second region after the removing the partial thickness of the side wall insulation film.

2. The semiconductor device production method as claimed in claim 1 wherein the second region increases in width towards the first region.

3. The semiconductor device production method as claimed in claim 1 wherein the removing the partial thickness of the side wall insulation film is carried out by removing the partial thickness of the side wall insulation film so that a part of the second region exposed by removing the side wall insulation film is included within a region where the second conductivity type impurity has diffused as a result of the heat treatment.

4. The semiconductor device production method as claimed in claim 1 wherein an edge of the side wall insulation film at a time of being formed during a formation of the side wall insulation film intersects an edge of the second region so that the remaining part of the second region is exposed on the first region side of an intersection of the edge of the side wall insulation film and the edge of the second region.

5. The semiconductor device production method as claimed in claim 1 wherein the silicide layer formed on the second region is shallower than an impurity diffusion region of the second conductivity type impurity.

6. The semiconductor device production method as claimed in claim 1 further comprising forming an electrically conductive member that electrically connects with the third region and the gate electrode.

7. The semiconductor device production method as claimed in claim 6 wherein the forming the electrically conductive member forms an electrically conductive member that electrically connects with the first region.

8. The semiconductor device production method as claimed in claim 1 wherein the forming the silicide layer forms a silicide layer on the third region, 9. The semiconductor device production method as claimed in claim 1 wherein the forming the side wall insulation film is preceded by implanting a second conductivity type impurity that has a conductivity type opposite to the first conductivity type into the first region and the second region using the gate electrode as a mask to a depth shallower than the impurity implanted using the gate electrode and the side wall insulation film as mask.

10. The semiconductor device production method as claimed in claim 1 wherein the second part has a width that is smaller than that of the third region crossed by the first part and included within the width of the second region and the third region.

11. The semiconductor device production method as claimed in claim 1 wherein the gate electrode has a T shape consisting of the first part and the second part.

* * * * *